(12) United States Patent
Yang

(10) Patent No.: US 6,245,592 B1
(45) Date of Patent: Jun. 12, 2001

(54) METHOD FOR FORMING CMOS SENSOR WITHOUT BLOOMING EFFECT

(75) Inventor: Sheng-Hsiung Yang, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/572,153

(22) Filed: May 17, 2000

(51) Int. Cl.⁷ .................................................. H01L 21/00
(52) U.S. Cl. ............................ 438/79; 438/527; 438/529
(58) Field of Search .............................. 438/79, 223, 224, 438/227, 228, 527, 529

(56) References Cited

U.S. PATENT DOCUMENTS

| | | | |
|---|---|---|---|
| 5,118,631 | * | 6/1992 | Dyck et al. |
| 5,371,033 | * | 12/1994 | Lee et al. |
| 6,046,069 | * | 4/2000 | Ishikawa et al. ............... 438/79 |
| 6,117,738 | * | 9/2000 | Tung ............................... 438/527 |

* cited by examiner

Primary Examiner—Trung Dang

(57) ABSTRACT

A method for forming complementary metal-oxide semiconductor sensor is disclosed. The method includes the following steps. Firstly, a semiconductor substrate is provided. A first oxide layer is formed on the surface of the semiconductor substrate. A nitride layer is formed on the surface of the first oxide layer. Thus, p-type ions are first implanted into the semiconductor substrate to form a p-type well region. The p-type well region is annealed. The nitride layer is removed. The first oxide layer is removed. The second oxide layer is deposited on the surface of the semiconductor substrate. The p-type ions are secondly implanted into the second p-type well region to form a p-type field. The p-type field is annealed. The n-type ions are thirdly implanted into the semiconductor substrate as an n-type region abutting the oxide layer below. The n$^+$-type ions are fourthly implanted into the n-type region as n$^+$-type regions. The p$^+$-type ions are fifthly implanted into the p-type field as a p$^+$-type region. The n$^+$-type region and the p+-type region are annealed to complete a semiconductor sensor device.

14 Claims, 8 Drawing Sheets

METHOD FOR FORMING CMOS SENSOR WITHOUT BLOOMING EFFECT

BACKGROUND OF THE INVENTION

1. Field of the Invention

The invention relates to the formation of a CMOS sensor, and more particularly to the formation of a CMOS sensor structure without blooming effect.

2. Description of the Prior Art

According to FIG. 1, a bird's beak 150 on field oxide area 140 inside the conventional complementary metal-oxide semiconductor (CMOS) sensor structure is a p-type field. Normally this p-type field owns higher concentration leading to leakage current.

For reducing leakage, the concentration of p-type field could be reduced. However, the isolation effect could be reduced as well after the concentration of p-type field is reduced. Thus, the blooming effect and the dark current will happen thus seriously destroying the general function of isolation inside the (CMOS) sensor structure.

SUMMARY OF THE INVENTION

In accordance with the present invention, a method is provided for forming a CMOS sensor that substantially reduces blooming effect.

Junction isolation including well doping, p-field implant and p+ implant can be used for the preferred embodiment. Also it can be combined with the formation process of the conventional CMOS structure.

In the preferred embodiment, the current leakage and the blooming effect can be efficiently eliminated.

In the preferred embodiment, firstly, a semiconductor substrate is provided. A first oxide layer is formed on the surface of the semiconductor substrate. A nitride layer is formed on the surface of the first oxide layer. A first photoresist layer is formed on the nitride layer as an implanting mask. Thus, first p-type ions are first implanted into the semiconductor substrate to form a p-type well region. The first photoresist layer is removed. The p-type well region is annealed. The nitride layer is removed. The first oxide layer is removed. The second oxide layer is deposited on the surface of the semiconductor substrate.

The second photoresist layer is formed on the second oxide layer as an implanting mask. The second p-type ions are second implanted into the p-type well region to form a p-type field located within the p-type well region, wherein concentration of the p-type field is higher than that of the p-type well regions. The second photoresist layer is removed. The p-type field is annealed. A third photoresist is formed on the second oxide layer as an implanting mask to cover the p-type field and p-type well region. The n-type ions are thirdly implanted into the semiconductor substrate as n-type regions around the p-type well region and are abutted the oxide layer below. The third photoresist is removed. The fourth photoresist is formed on the surface of the second oxide layer as an implanting mask to cover the p-type field and the p-type well region and portions of the n-type regions. The n+-type ions are fourth implanted into the n-type region as n+-type regions located within the n-type region. The fourth photoresist are removed. The fifth photoresist is formed on the surface of the second oxide layer as an implanting mask to cover the n-type region and the n+-type region and the p-type well region and portions of p-type field region. The p+-type ions are fifthly implanted into the p-type field as a p+-type region located within the p-type field. The n+-type region and the p+-type region are annealed to complete a semiconductor sensor device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a preferred embodiment directed to a CMOS sensor structure, it is not intended that these illustrations be limitations on the scope or applicability of the present invention. Further, while the illustrative examples use an n-type well region, it should be recognized that the arsenic portions may be replaced with the phosphorus portions. Thus, it is not intended that the semiconductor devices of the present invention be limited to the structures illustrated. These devices are included to demonstrate the utility and application of the present invention in accordance with the presently preferred embodiments.

The spirit of the proposed invention can be explained and understood by the following embodiments with corresponding figures for forming a semiconductor sensor device.

Figure 1:
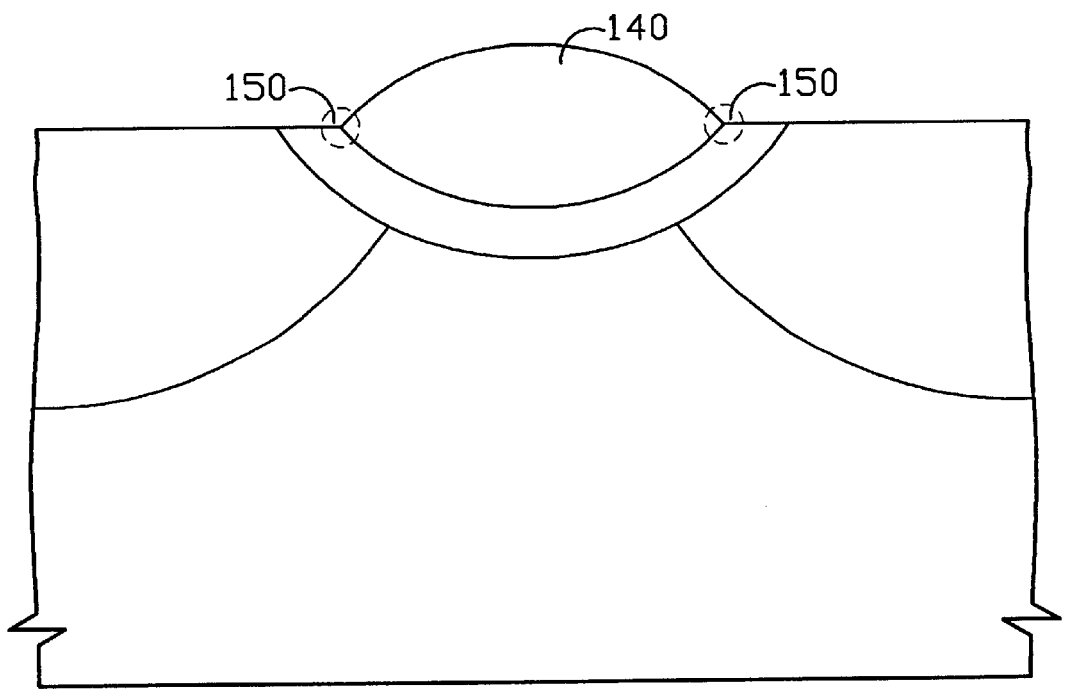
FIG. 1 is a cross-section diagram schematically illustrating the prior art.
Figure 2A:
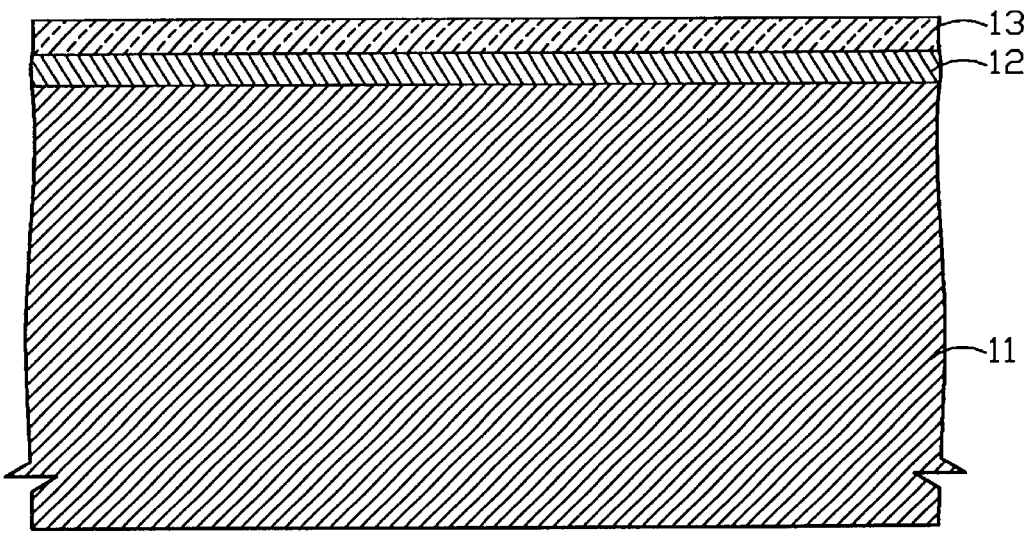
FIGS. 2A through 2N are illustrative of various components of the structure according to the first embodiment of the present invention.

With reference to FIG. 2A, firstly, a semiconductor substrate 11 is provided. A first oxide layer 12 is formed on the surface of the semiconductor substrate 11. The formation temperature is about 800° C. to 900° C. The depth of this first oxide layer 12 is about 150 angstroms. A nitride layer 13 is formed on the surface of the first oxide layer 12 using conventional chemical vapor deposition. The formation temperature is about 400° C. to 450° C. and the formation atmosphere is about 1 torr. The depth of this nitride layer 13 is about 1500 angstroms.

Figure 2B:
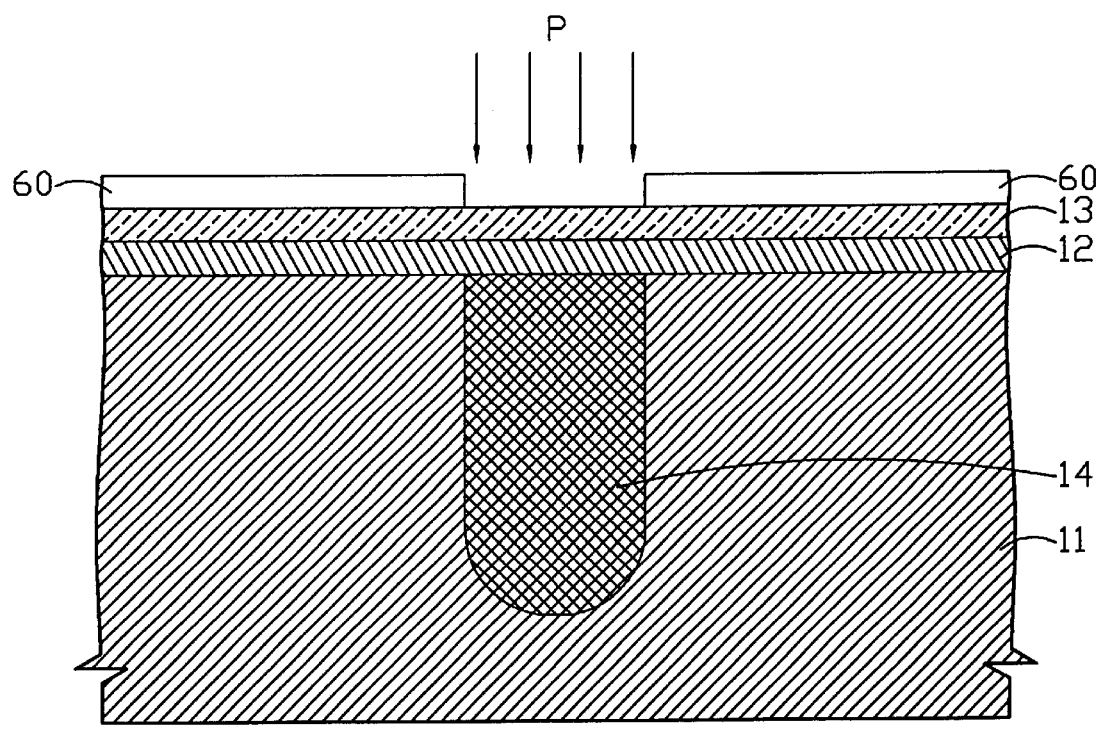

As shown in FIG. 2B, the first photoresist layer 60 is formed on the nitride layer 13 as an implanting mask using conventional photolithography. Thus, first p-type ions such as boron are first implanted into the semiconductor substrate 11 to form a p-type well region 14.

Figure 2C:
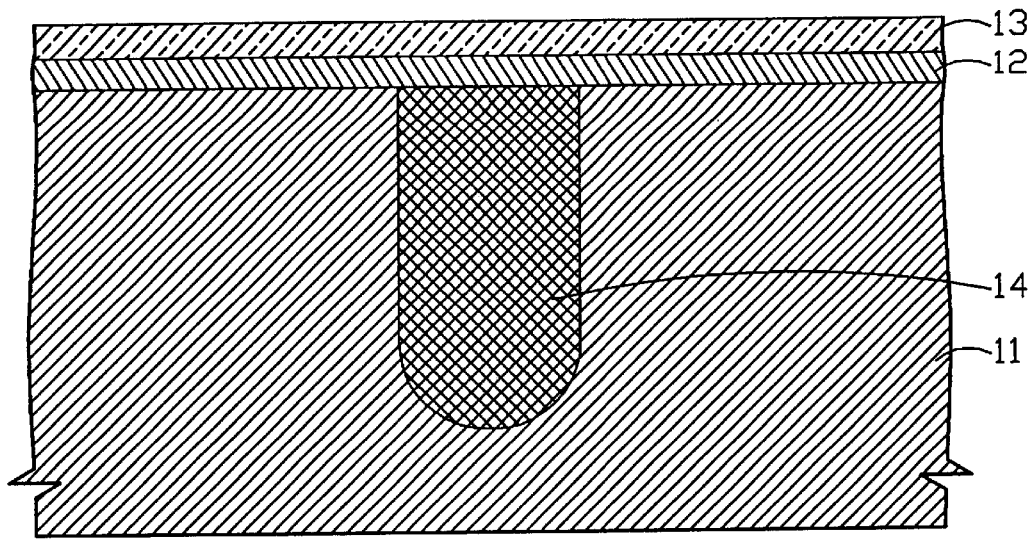

As shown in FIG. 2C, the first photoresist layer 60 is removed by conventional plasma dry etching.

Figure 2D:
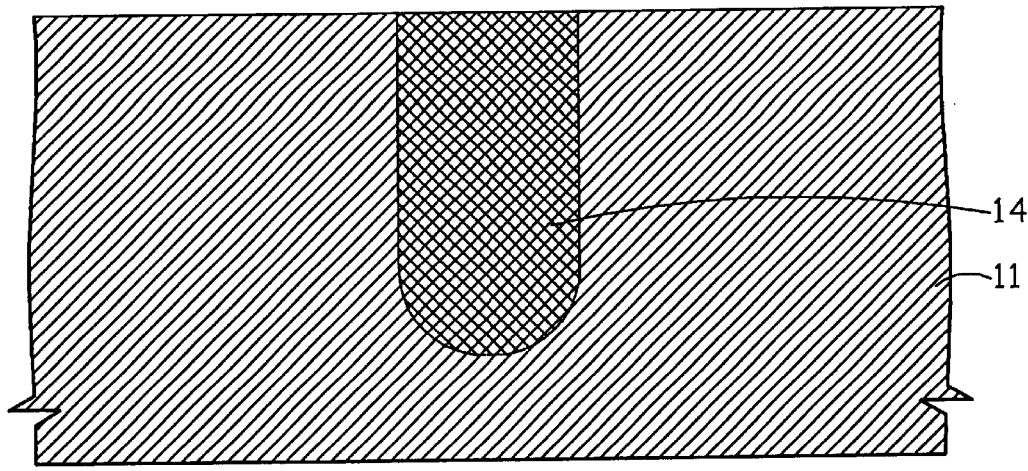

As shown in FIG. 2D, the p-type well region 14 is annealed using conventional rapid thermal process (RTP). The RTP temperature is about 1000° C. and the duration is about 15 seconds. Then, the nitride layer 13 is removed and the first oxide layer 12 is removed using conventional dry plasma etching.

Figure 2E:
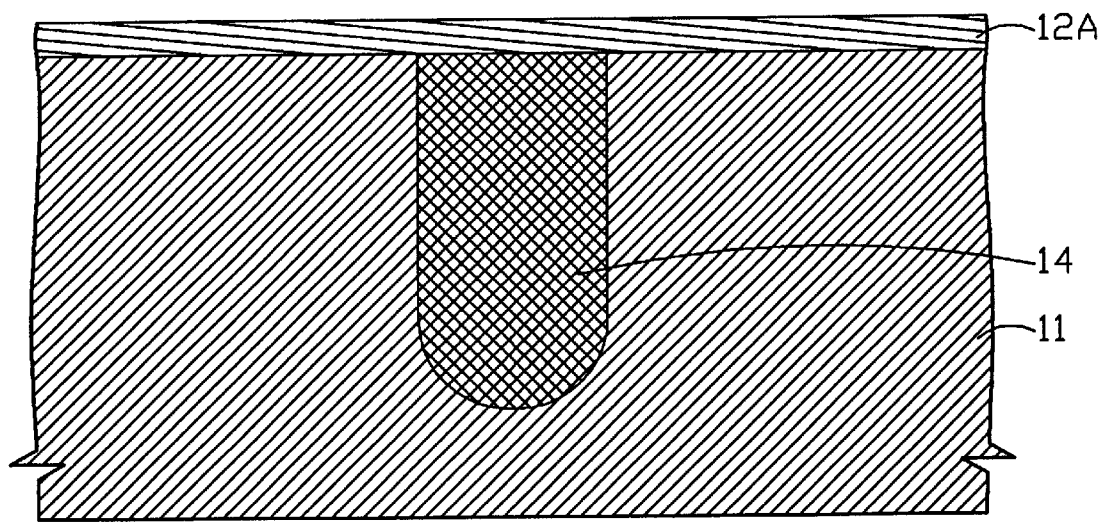

As shown in FIG. 2E, the second oxide layer 12A is deposited on the surface of the semiconductor substrate 11. The formation temperature is about 400° C. to 450° C. and the formation atmosphere is about 1 torr. The depth of this first oxide layer 12A is about 150 angstroms.

Figure 2F:
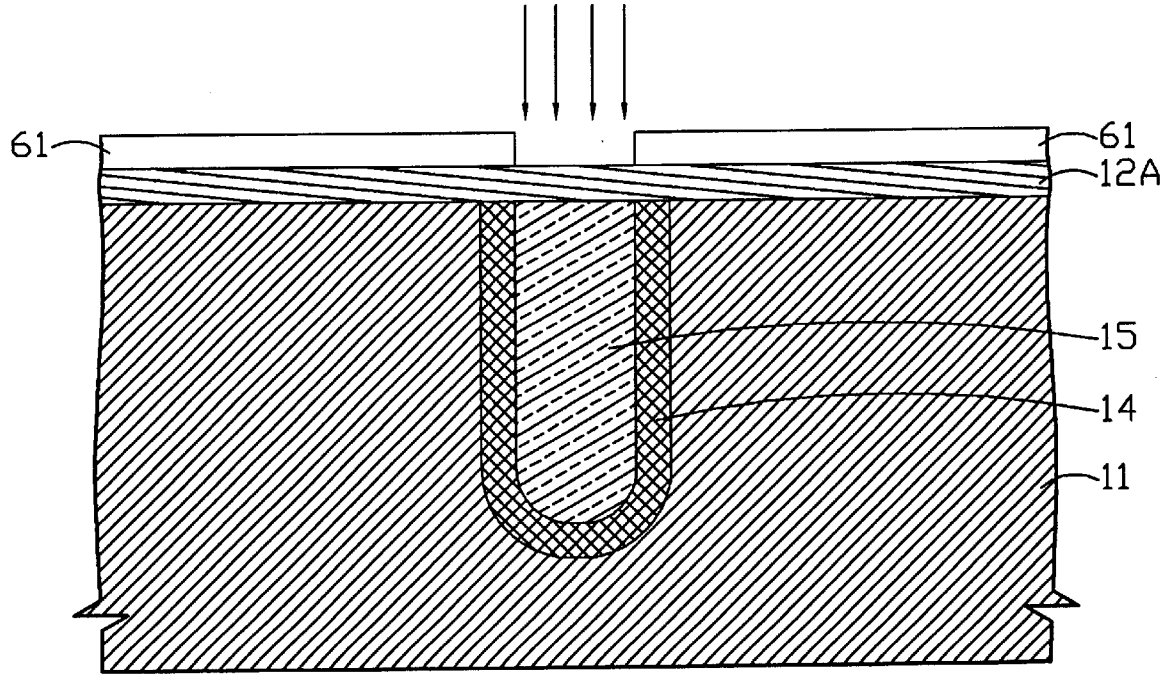

As shown in FIG. 2F, the second photoresist layer 61 is formed on the oxide layer 12A as an implanting mask using conventional photolithography. The second p-type ions such as boron are secondly implanted into the p-type well region 12 to form a p-type field 15 located within the p-type well region. The concentration of the p-type field 15 is higher than the concentration of the p-type well region 14. The depth of the p-type field 15 is about 10000 angstroms.

Figure 2G:
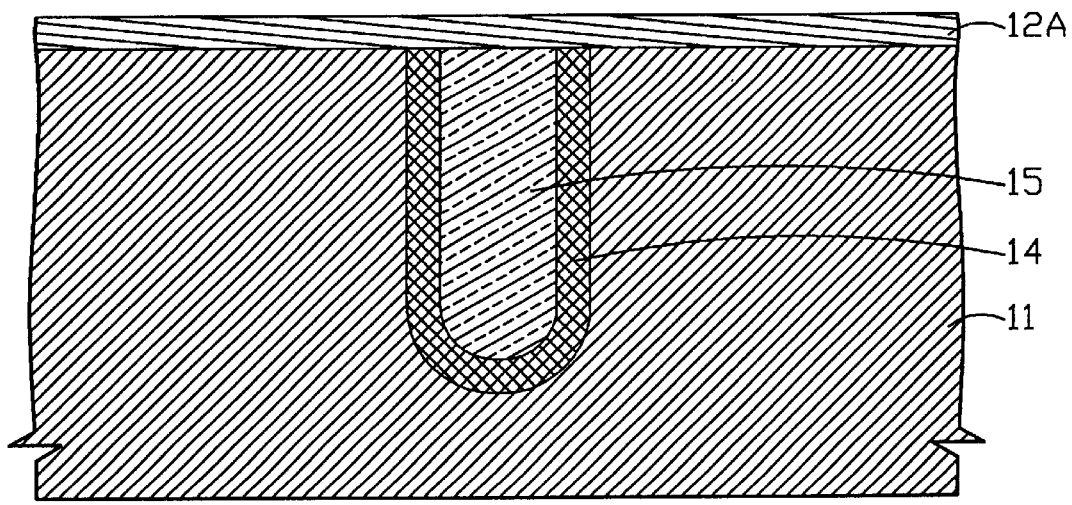

As shown in FIG. 2G, the second photoresist layer 61 is removed using conventional plasma dry etching. The p-type field is annealed using conventional rapid thermal process (RTP). The RTP temperature is about 1000° C. and the duration is about 15 seconds.

Figure 2H:
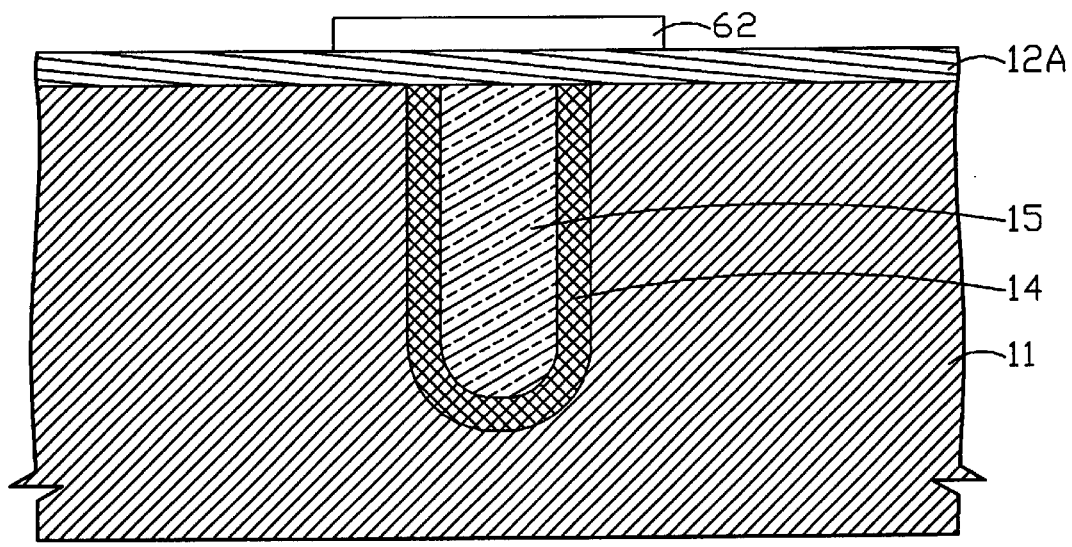

As shown in FIG. 2H, the third photoresist 62 is formed on the oxide layer 12A as an implanting mask using conventional techniques to cover the p-type field 15 and the p-type well region 14.

Figure 2I:
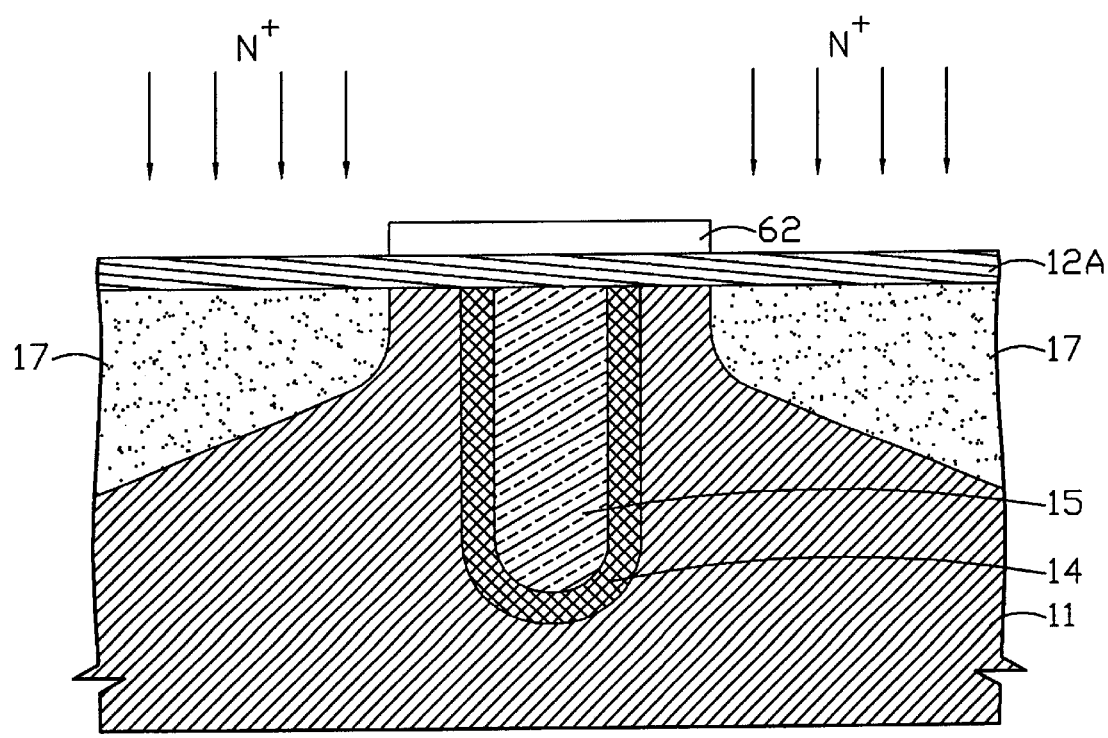

As shown in FIG. 2I, the n-type ions such as arsenic and phosphorus are thirdly implanted into the semiconductor substrate 11 as n-type regions 17 abutted the second oxide layer 12A below.

Figure 2J:
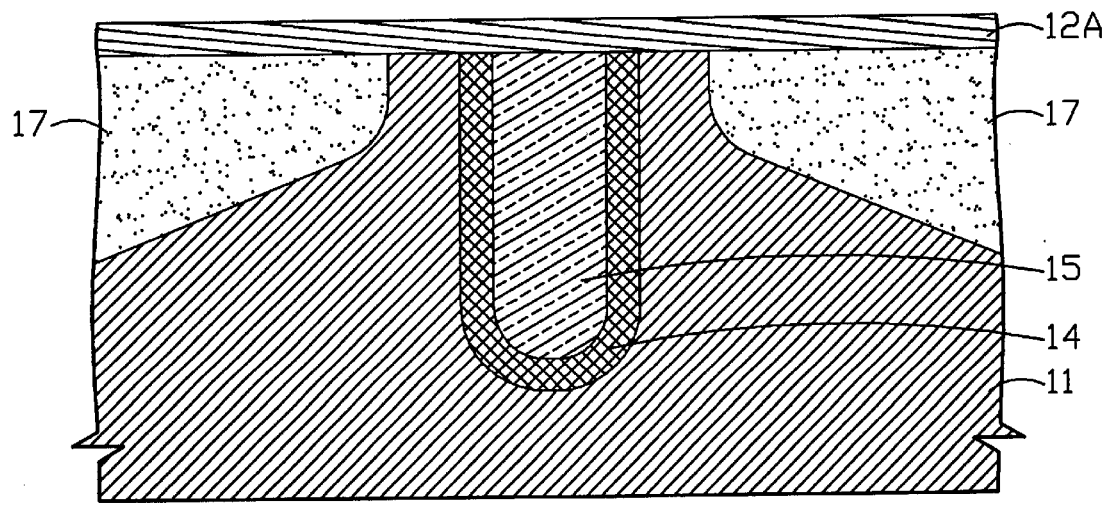

As shown in FIG. 2J, the third photoresist 62 is removed using conventional plasma dry etching.

Figure 2K:
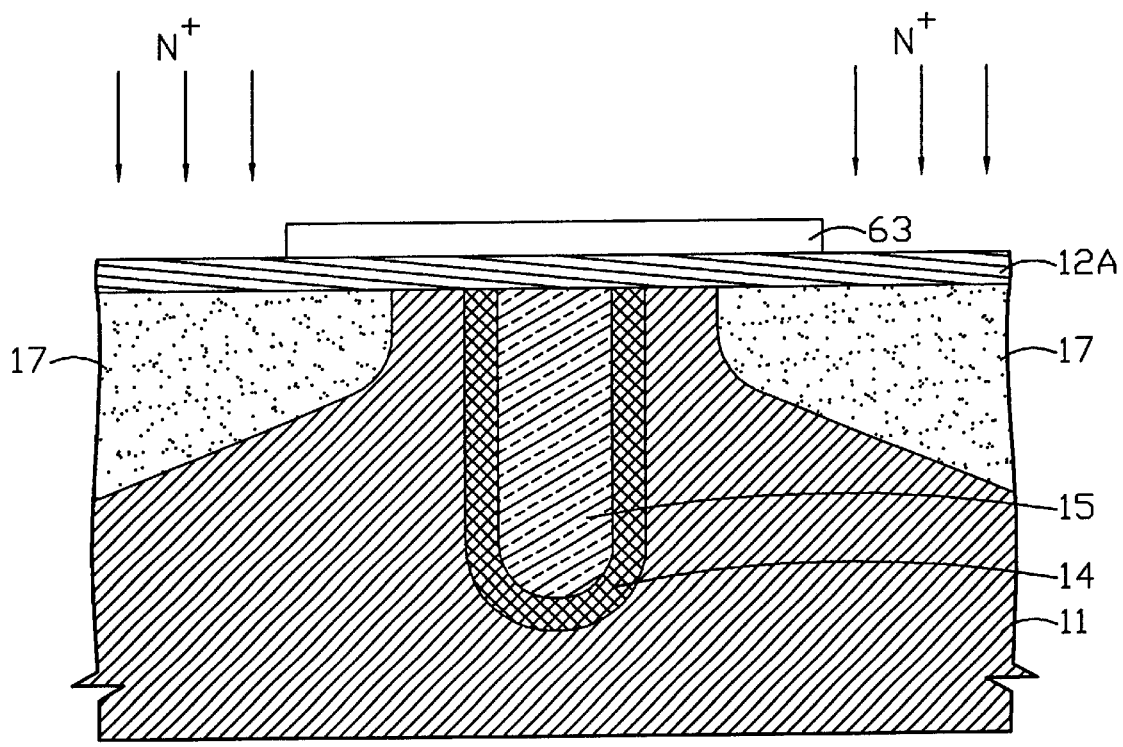

As shown in FIG. 2K, the fourth photoresist 63 is formed on the surface of the second oxide layer 12A as an implanting mask using conventional photolithography to cover the p-type field 15 and the p-type well region 14 and portions of the n-type region 17. Then, the $n^+$-type ions such as $P^+$ ion are fourthly implanted into the n-type regions 17 as $n^+$-type regions 18 located within the p-type field.

Figure 2L:
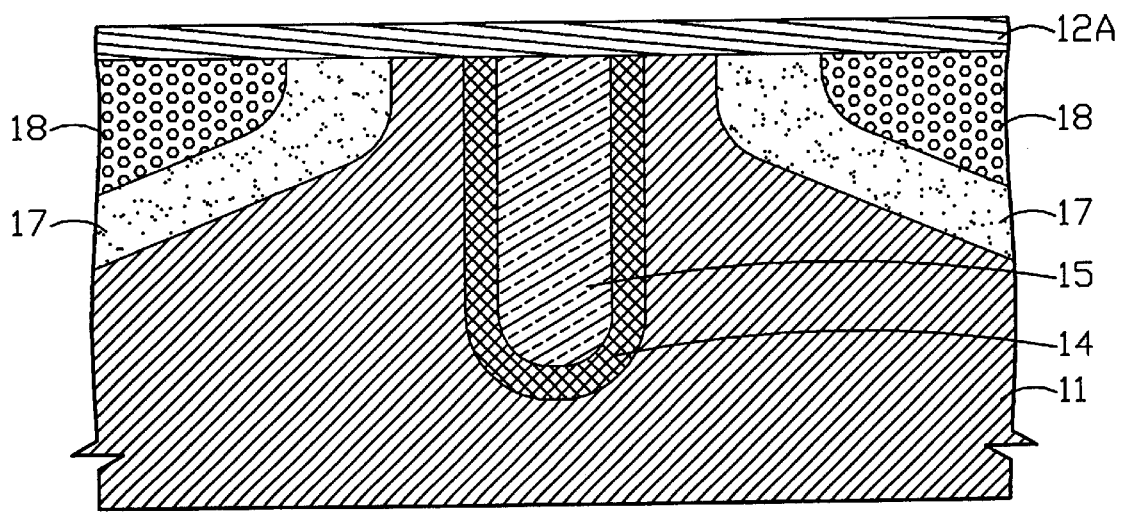

As shown in FIG. 2L, the fourth photoresist 63 is removed by conventional plasma dry etching.

Figure 2M:
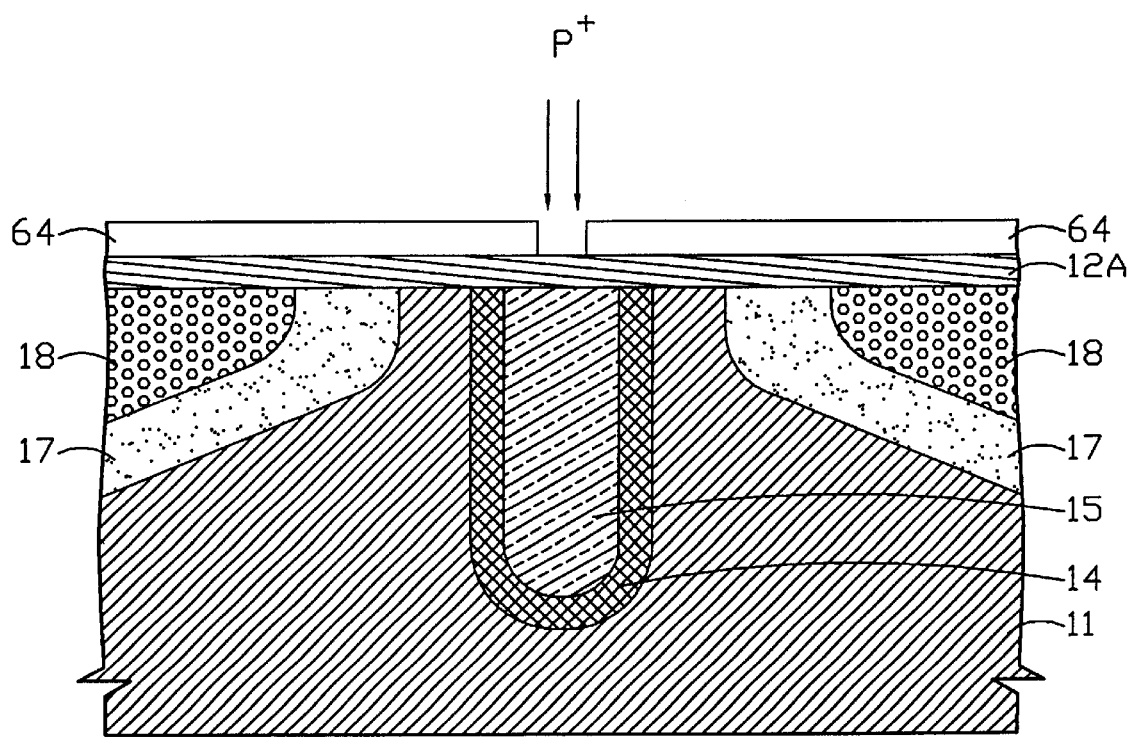

As shown in FIG. 2M, the fifth photoresist 64 is formed on the surface of the second oxide layer 12A as an implanting mask to cover the n-type region 17 and the $n^+$-type region 18 and the p-type well region 14 and portions of p-type field region 15. Then, $p^+$-type ions such as $BF_2^+$ ion are fifthly implanted into the p-type field 15 as a $p^+$-type region 16 located within the p-type field, as FIG. 2M.

Figure 2N:
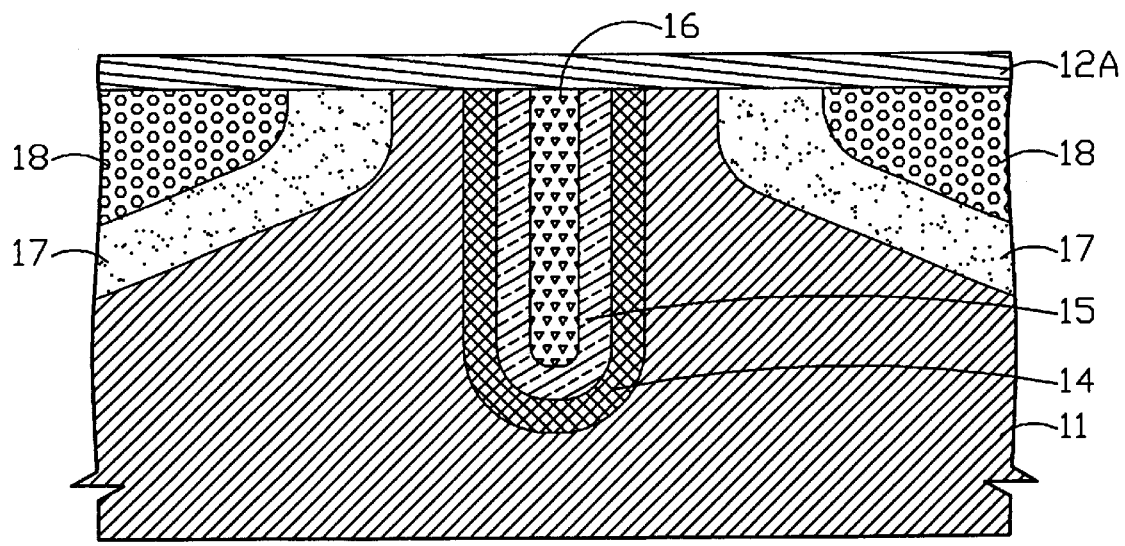

As shown in FIG. 2N, the fifth photoresist 64 is removed using conventional plasma dry etching, then the $n^+$-type region 18 and the $p^+$-type region 16 are annealed using conventional rapid thermal process (RTP) to complete a semiconductor sensor device. The RTP temperature is about 1000° C. and the duration is about 15 seconds.

In accordance with the present invention, a method is provided for forming a CMOS sensor that substantially reduces the blooming effect. Junction isolation including well doping, p-field implant and $p^+$ implant can be used for this preferred embodiment. Also it can be combined with the formation process of conventional CMOS structure. In the preferred embodiment, the current leakage and the blooming effect can be efficiently dismissed.

According to the present invention, a semiconductor substrate is provided. A first oxide layer is formed on the surface of the semiconductor substrate. A nitride layer is formed on the surface of the first oxide layer. A first photoresist layer is formed on the nitride layer as an implanting mask. Thus, first p-type ions are first implanted into the semiconductor substrate to form p-type well regions. The first photoresist layer is removed. The p-type well region is annealed. The nitride layer is removed. Then, the first oxide layer is removed. The second oxide layer is deposited on the surface of the semiconductor substrate.

The second photoresist layer is formed on the second oxide layer as an implanting mask. The second p-type ions are second implanted into the p-type well region to form a p-type field located within the p-type well region, wherein the concentration of the p-type field is higher than that of the p-type well region. Then, the second photoresist layer is removed. The p-type field is annealed. A third photoresist is formed on the second oxide layer as an implanting mask to cover the p-type field and the p-type well region. The n-type ions are thirdly implanted into the semiconductor substrate as an n-type region around the p-type well region and abut the oxide layer below. The third photoresist is removed. The fourth photoresist is formed on the surface of the second oxide layer as an implanting mask to cover the p-type field and the p-type well region and portions of n-type region. The $n^+$-type ions are fourthly implanted into the n-type region as $n^+$-type regions located within the n-type region. The fourth photoresist is removed. The fifth photoresist is formed on the surface of the second oxide layer as an implanting mask to cover the n-type region and the $n^+$-type region and the p-type well region and portions of p-type field region. The $p^+$-type ions are fifthly implanted into the p-type field as a $p^+$-type region located within the p-type field. The fifth photoresist is removed. Then, the $n^+$-type region and the $p^+$-type region are annealed to complete a semiconductor sensor device.

Although specific embodiments have been illustrated and described, it will be obvious to those skilled in the art that various modifications may be made without departing from what is intended to be limited solely by the appended claims.

What is claimed is:

1. A method for forming a semiconductor sensor device, comprising:

providing a semiconductor substrate;

forming a first oxide layer on the surface of the semiconductor substrate;

forming a nitride layer on the surface of the first oxide layer;

first implanting ions of a first conductivity into the semiconductor substrate to form a first conductivity ion well region;

annealing the first conductivity ion well region;

removing the nitride layer;

removing the first oxide layer;

depositing the second oxide layer on the surface of the semiconductor substrate;

second implanting ions of the first conductivity into the first conductivity well region to form a first conductivity field located within the first conductivity well region, wherein concentration of the first conductivity field is higher than that of the that of the first conductivity well region;

third implanting ions of a second conductivity into the semiconductor substrate as the second conductivity region around the first conductivity well region and abutted the second oxide layer below;

fourth implanting ions of the second conductivity into the second conductivity region as the second conductivity region, wherein said the concentration of the second conductivity ion for the fourth implanting is larger than the concentration of the second conductivity ion for the third implanting; and fifth implanting ions of the first conductivity into the first conductivity field as first conductivity region located within the first conductivity field, wherein said the concentration of the first conductivity ion for the fifth implanting is larger than the concentration of the first conductivity ion for the second implanting.

2. The method according to claim 1, wherein said first conductivity ion comprises boron.

3. The method according to claim 1, wherein the depth of said first conductivity well region is about 30000 angstroms.

4. The method according to claim 1, wherein said second oxide layer is about 150 angstroms.

5. The method according to claim 1, wherein said second conductivity ion is selected from the group consisting of arsenic and phosphorus.

6. The method according to claim 1, wherein said second conductivity ion for the fourth implanting comprises $P^+$ ion.

7. The method according to claim 1, wherein said first conductivity ion for the fourth implanting comprises $BF_2^+$ ion.

8. A method for forming a semiconductor sensor device, comprising:

providing a semiconductor substrate;

forming a first oxide layer on the surface of the semiconductor substrate;

forming a nitride layer on the surface of the first oxide layer;

forming the first photoresist layer on the nitride layer as an implanting mask;

first implanting ions of a first conductivity into the semiconductor substrate to form a first conductivity ion well region;

removing the first photoresist layer;

annealing the first conductivity well region;

removing the nitride layer;

removing the first oxide layer;

depositing the second oxide layer on the surface of the semiconductor substrate;

forming the second photoresist layer on the oxide layer as an implanting mask;

second implanting ions of the first conductivity into the first conductivity well region to form a first conductivity field located within the first conductivity well region, wherein concentration of the first conductivity field is higher than that of the that of the first conductivity well region;

removing the second photoresist layer;

annealing the first conductivity field;

forming the third photoresist on the oxide layer as an implanting mask to cover the first conductivity field and the first conductivity well region;

third implanting ions of a second conductivity into the semiconductor substrate as the second conductivity region around the first conductivity well region and abutted the second oxide layer below;

removing the third photoresist;

forming the fourth photoresist on the surface of the second oxide layer as an implanting mask to cover the first conductivity field and the first conductivity well region and portions of the second conductivity region;

fourth implanting ions of the second conductivity into the second conductivity region as the second conductivity region, wherein said the concentration of the second conductivity ion for the fourth implanting is larger than the concentration of the second conductivity ion for the third implanting;

removing the fourth photoresist;

forming the fifth photoresist on the surface of the second oxide layer as an implanting mask to cover the second conductivity region and the second conductivity region and the first conductivity well region and portions of first conductivity field region;

fifth implanting ions of the first conductivity into the first conductivity field as first conductivity region located within the first conductivity field, wherein said the concentration of the first conductivity ion for the fifth implanting is larger than the concentration of the first conductivity ion for the second implanting removing the fifth photoresist; and annealing the second conductivity region and the first conductivity region to complete the complementary metal-oxide semiconductor sensor structure.

9. The method according to claim 8, wherein said first conductivity ion comprises boron.

10. The method according to claim 8, wherein the depth of said first conductivity well region is about 30000 angstroms.

11. The method according to claim 8, wherein said second oxide layer is about 150 angstroms.

12. The method according to claim 8, wherein said second conductivity ion is selected from the group consisting of arsenic and phosphorus.

13. The method according to claim 8, wherein said second conductivity ion for the fourth implanting comprises $P^+$ ion.

14. The method according to claim 8, wherein said first conductivity ion for the fourth implanting comprises $BF_2^+$ ion.

* * * * *